United States Patent [19]
Springer

[11] Patent Number: 5,601,654
[45] Date of Patent: Feb. 11, 1997

[54] FLOW-THROUGH ION BEAM SOURCE

[75] Inventor: Robert W. Springer, Los Alamos, N.M.

[73] Assignee: The Regents of the University of California, Office of Technology Transfer, Alameda, Calif.

[21] Appl. No.: 657,844

[22] Filed: May 31, 1996

[51] Int. Cl.$^6$ ............................................. C23C 16/00
[52] U.S. Cl. .................. 118/723 HC; 156/345; 156/643.1
[58] Field of Search ............ 118/723 HC, 723 E, 118/723 ER, 723 MP, 723 MR, 723 MA; 156/345; 204/192.11, 298.04, 298.36

[56] References Cited

U.S. PATENT DOCUMENTS

| | | | |
|---|---|---|---|
| 3,895,602 | 7/1975 | Bobenrieth | 118/726 |
| 4,250,009 | 2/1981 | Cuomo et al. | 204/192 |
| 4,381,453 | 4/1983 | Cuomo et al. | 250/398 |
| 4,457,803 | 7/1984 | Takigawa | 156/626 |
| 4,481,062 | 11/1984 | Kaufman et al. | 156/345 |
| 4,541,890 | 9/1985 | Cuomo et al. | 156/345 |
| 4,637,869 | 1/1987 | Glocker et al. | 204/192 |
| 4,673,475 | 6/1987 | Windischmann | 204/192 |
| 4,731,540 | 3/1988 | Schmidt | 250/492.2 |
| 5,108,535 | 4/1992 | Ono et al. | 156/345 |
| 5,342,448 | 8/1994 | Hamamura et al. | 118/723 FI |
| 5,342,660 | 8/1994 | Cann et al. | 427/577 |
| 5,346,600 | 9/1994 | Nieh et al. | 204/192 |
| 5,455,081 | 10/1995 | Okada et al. | 427/528 |
| 5,462,629 | 10/1995 | Kubota et al. | 156/345 |
| 5,462,635 | 10/1995 | Ono et al. | 216/67 |
| 5,498,290 | 3/1996 | Matossian et al. | 118/723 E |

OTHER PUBLICATIONS

Kaufman, Harold R., "Technology of Ion Beam Sources Used in Sputtering," *Journal of Vacuum Science Technology*, 15(2) Mar./Apr. 1978, pp. 272–276.

Singer, Peter, ed., "Filling Contacts and Vias: A Progress Report," *Semiconductor International*, Feb. 1996, pp. 89–94.

Rossnagel, S. M., "Ionized Magnetron Sputtering for Lining and Filling Trenches and Vias," *Semiconductor International*, Feb. 1996, pp. 99–102.

*Primary Examiner*—R. Bruce Breneman
*Assistant Examiner*—Joni Y. Chang
*Attorney, Agent, or Firm*—Gemma Morrison Bennett

[57] ABSTRACT

A method and an apparatus for forming a charge neutral ion beam which is useful in producing thin films of material on electrically conductive or non-conductive substrates are provided.

8 Claims, 4 Drawing Sheets

FLOW-THROUGH ION BEAM SOURCE

This invention was made with government support under Contract No. W-7405-ENG-36 awarded by the U.S. Department of Energy. The government has certain rights in the invention.

TECHNICAL FIELD

This invention relates to deposition of thin film coatings by means of ion bombardment.

BACKGROUND ART

Much research has been done to develop better methods of applying coatings, or thin films, to various types of articles. Purposes for adding a coating on an article include improving wear resistance, reducing friction, improving heat resistance, and enhancing or providing electrical conductivity. Thin film deposition is an important procedure in manufacture of microelectronics components. Thin film deposition is presently done using ion-beam-assisted deposition, which has limited deposition rates and requires large processing chamber space and two separate ion guns at large angles to the normal of the substrate to produce oriented films.

An object of this invention is to provide an apparatus for depositing a highly adherent coating.

Another object of this invention is to provide an apparatus for rapidly producing thin films of superior smoothness.

A further object is to provide an apparatus for thin film deposition on electrically non-conductive substrates.

A still further object of this invention is to provide an apparatus capable of producing coatings of crystalline materials having specific crystal orientations rather than randomly oriented structures.

An additional object of this invention is to provide an ion gun capable of depositing a coating comprised of any material which can be vaporized.

Yet another object of this invention is to provide an ion source which can be used to clean a substrate before the same source is used to apply a coating.

Another object of this invention is to provide a charge neutral ion beam.

DISCLOSURE OF INVENTION

A method and an apparatus for forming a charge neutral ion beam which is useful in depositing thin films of material on electrically conductive or non-conductive substrates are provided. The present invention is a flow-through ion gun and a process for forming an ion beam which is more versatile than prior art methods and apparatuses for depositing thin films.

More particularly an apparatus is provided for forming a charge neutral ion beam. The apparatus comprises:

(a) a means for isolating a plasma from its surrounding environment having a delivery aperture through which an ion beam passes, wherein said ion beam is formed of ions produced in said plasma;

(b) a plasma chamber having a receiving end and a discharge end, said plasma chamber being disposed within said isolating means in such manner that ions which pass out of said plasma chamber discharge end pass through said delivery aperture;

(c) a means for establishing a positive electrical potential between said plasma chamber and a reference location, whereby the magnitude of said electrical potential is effective to form a plasma;

(d) a means for providing plasma gas to said receiving end of said plasma chamber;

(e) a means for providing electrons to said receiving end of said plasma chamber;

(f) a means for providing a magnetic field within said isolating means, such that lines of force of said magnetic field are normal to an electric field formed as a result of said electrical potential applied to said plasma chamber;

(g) an accelerating grid disposed across said ion beam in a location adjacent to said plasma chamber and within said isolating means;

(h) a means for maintaining a negative electrical potential between said accelerating grid and said reference location;

(i) a means for providing electrons to said ion beam in a sufficient quantity to substantially neutralize said ion beam, wherein said electron providing means is located downstream of said accelerating grid;

(j) a retarding grid disposed adjacent to said plasma chamber receiving end;

(k) a means for maintaining said retarding grid at a positive electrical potential about equal to the value of said plasma chamber electrical potential; and (l) a means for providing a feed material to said receiving end of said plasma chamber.

Also in another more particular aspect, there is provided a method of forming a charge neutral ion beam comprising:

(a) establishing a positive electrical potential effective to cause formation of a plasma between a plasma chamber and a reference location;

(b) establishing a magnetic field within said plasma chamber, such that lines of force of said magnetic field are substantially normal to an electric field formed as a result of said electrical potential applied to said plasma chamber;

(c) providing electrons to a receiving end of said plasma chamber;

(d) providing a plasma gas to said plasma chamber receiving end, thereby establishing a plasma and forming an ion beam comprised of plasma ions which pass out of a discharge end of said plasma chamber;

(e) preventing ions from passing out of said receiving end of said plasma chamber by placing a retarding grid adjacent to said receiving end, where said retarding grid is maintained at a positive electrical potential about equal to the value of said plasma chamber electrical potential;

(f) accelerating ions of said ion beam by means of an accelerating grid disposed across said ion beam, where said accelerating grid is maintained at a negative electrical potential effective to accelerate ions;

(g) neutralizing said ion beam by providing electrons to said ion beam at a location downstream of said accelerating grid; and (h) providing feed material to said plasma chamber receiving end, whereby said feed material is ionized and ions formed from said feed material become a part of said ion beam.

BEST MODES FOR CARRYING OUT THE INVENTION

It has been discovered that charge neutral ion beams useful for deposition of thin films onto electrically conductive or non-conductive substrates can be produced by an ion beam source (gun) having two open ends with electrically charged grids which allows for both a plasma-forming gas feed and a feed for normally solid or liquid materials.

The arrangement of an electromagnetic coil and the electrically charged grids ensures that electrons formed in the ion beam source of this invention flow outward with a spiraling movement from a plasma chamber in a single direction. This arrangement is shown with more particularity in FIG. 1.

Figure 1:
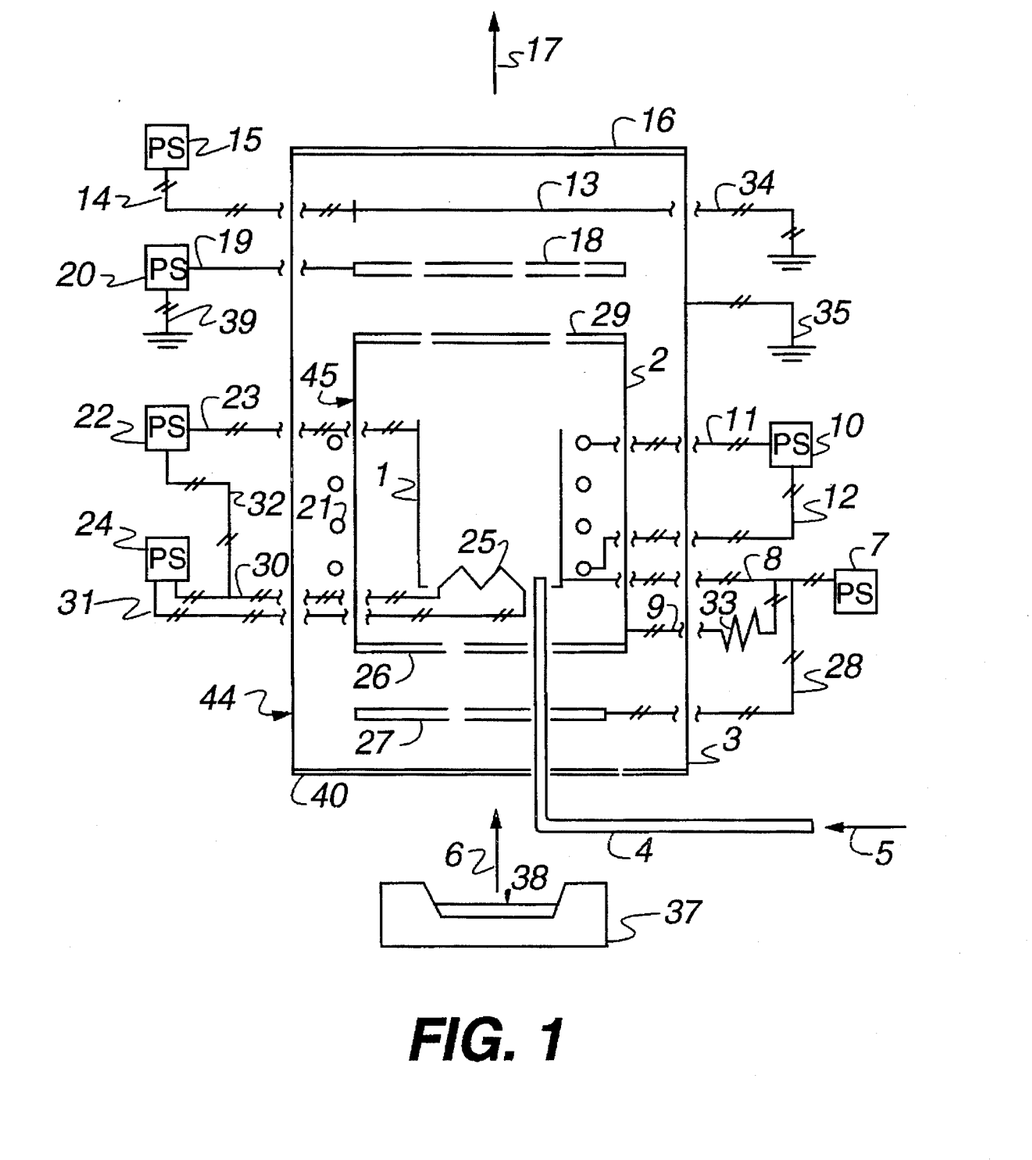
FIG. 1 is a schematic of the apparatus of this invention showing the electrical circuitry.

Referring to FIG. 1, a charge neutral ion beam indicated by arrow 17 passes out of an enclosure 44, which is comprised of a hollow cylinder 3 of electrically conductive material with grids 16 and 40 covering the ends of the cylinder 3. The enclosure 44 can be from about 2" to about 30" in diameter and from about 2" to about 10" long. It is presently believed that for most applications larger sizes are preferable because the ionization efficiently is higher for the energy input to the plasma.

A plasma is lit, or established, in a plasma chamber 1 in order to produce ions which comprise the charge neutral ion beam. The plasma chamber 1 is a hollow cylinder of electrically conductive material typically having a diameter from about 1.5" to about 25" and a length from about 2" to about 8".

A discharge filament 25 is located at the lower end of the plasma chamber 1 and is connected to a power supply 24 by wires 30 and 31. The discharge filament 25 is comprised of a material, such as tungsten, which emits electrons when it is heated to a sufficient temperature (thermionic emission). Electrical current to heat the discharge filament 25 is provided by means of the discharge filament power supply 24. A second power supply 22 provides an electrical potential between the plasma chamber 1 and the discharge filament 25 in order to light and sustain the plasma. The positive terminal of the second power supply 22 is connected to the plasma chamber 1 by wire 23 and the negative terminal is connected to wire 30 or to the negative terminal of power supply 24 by means of a wire 32, so that power supply 22 floats on the discharge filament power supply 24.

Plasma gas is provided to the lower end of the plasma chamber 1 through a conduit 4 from a convenient source, as indicated by arrow 5. Electrons emitted from the discharge filament 25 ionize the feed gas to create a plasma.

A large positive electrical potential is applied to the plasma chamber 1 by means of a third power supply 7 and wire 8. The third power supply 7 is grounded by means of a wire 36. The purpose of biasing the plasma chamber 1 by means of the third power supply 7 is to impart energy with respect to ground to ions created in the plasma chamber 1.

After the plasma is lit, it also flows into a floating chamber 45.

The floating chamber 45 is comprised of a hollow cylinder 2 of electrically conductive material with its ends covered by grids 26 and 29. The floating chamber 45 is connected to the positive side of the third power supply 7 by a wire 9. A resistor 33 is provided between the third power supply 7 and the floating chamber 45 in order to limit current flow. The floating chamber 45 serves to partially confine and control the plasma. An outer enclosure 44 and the floating chamber 45 are means for isolating the plasma from the environment surrounding it.

A magnetic field is provided by an electromagnetic coil 21 which surrounds a portion of the floating chamber 45, as depicted by reference number 21. Power for the electromagnetic coil 21 is provided by a fourth power supply 10 by means of wires 11 and 12. Alternatively, an equivalent magnetic field could be provided by permanent magnets. The purpose of the magnetic field is to cause electrons emitted by the discharge filament 25 to follow spiral paths in an inward direction rather than travel directly to the walls of the plasma chamber 1. Increased electron path lengths resulting from providing a magnetic field having a direction perpendicular to that of the electric field increase the likelihood of a collision between an electron and a molecule of plasma gas.

An accelerator grid 18 is placed above the floating chamber 45 to increase the number of ions accelerated from the floating chamber 45. This grid 18 is maintained at a negative voltage by means of a fifth power supply 20, which is connected to the accelerator grid 18 by means of a wire 19. The accelerator grid power supply 20 is grounded by means of another wire 39.

The ion beam is neutralized by electrons emitted from a neutralizing filament 13, which is a material, such as tungsten, that emits electrons upon being heated. A sixth power supply 15 provides electrical current to heat the neutralizing filament 13 by means of a wire 14. The filament circuit is completed by means of a wire 34 to a ground. Electrons emitted by the neutralizing filament 13 do not combine with the positive ions of the beam to neutralize the ions, but instead become part of the beam as a result of attraction of the electrons by the positive ions. The beam is a stream of positive ions and electrons and may be termed a charge neutral ion beam when equal numbers of positive and negative charges are present.

A retarding grid 27 is placed below the floating chamber 45 in order to prevent positive ions from moving downward. The retarding grid 27 is maintained at the same positive electrical potential as the plasma chamber 1 by means of being connected to the plasma chamber biasing power supply 7 by wire 28. The outer enclosure 44, which is grounded by means of a wire 35, provides an electrical reference for the apparatus and prevents electrical coupling with the environment surrounding the apparatus. The plasma chamber end grid 40 prevents electrons from being attracted to the retarding grid 27.

Both the accelerator grid 18 and the retarding grid 27 have square openings from about one-fourth inch to about one-half inch. Generally, the accelerator grid 18 should have larger openings than the retarding grid 27. These grid openings are larger than those useful in the Kaufman-type ion beam guns in which the top grids are used for aperture lenses and there are no retarding grids. In the present invention, the accelerator grid 18 does not function as an aperture lens.

A crucible 37 contains feed material 38, which is vaporized by any convenient source of heat and flows upward into plasma chamber 1, as depicted by arrow 6. Alternatively, a feed conduit for a gaseous feed could be used in the stead of the crucible for normally liquid or solid feed material. Once in the plasma chamber 1, the feed material 38 is ionized by means of two mechanisms. The first is collisions with electrons emitted by the discharge filament 25. The second mechanism is Penning ionization, which occurs if the excited levels of the plasma gas are deep enough to cause ionization of the feed material. Penning ionization is caused by collisions of molecules of feed material with plasma gas ions. Thus, the ion beam indicated by arrow 17 contains ions of the feed material in addition to ions of the plasma gas. Generally a charge neutral ion beam is preferred, particularly when non-conductive materials are being coated. However, if electrically conductive material is being coated, an ion beam having a positive charge can be employed.

The plasma can be monitored by any suitable means such as a probe having negative potential which measures the ion current. The information from the probe can be used to make needed adjustments in the plasma gas pressure, the magnetic field, or the feed gas pressure by monitoring the extracted ion current density.

In use of the experimental apparatus of this invention, voltage applied to the discharge filament 25 is in the range from about 200 to about 600 volts. The electrical potential between the discharge filament 25 and plasma chamber 1 is normally from about 50 to about 100 volts. The positive biasing voltage applied by means of the plasma chamber power supply 7 is in the range of about 200 to 600 volts. The potential applied to the accelerator grid 18 is from about 25 to about 100 volts negative, relative to the reference potential, or ground. The neutralizing filament power supply 15 provides from about 5 to about 20 volts to the neutralizing filament 13. The resistor 33 through which the floating chamber 45 is connected to the biasing voltage power supply has a rating of 10,000 ohms. It has been determined that electrically connecting the retarding grid 27 to the plasma chamber 1 is optimal, although, in theory, it could be slightly more positive than the reference supply applied to the discharge filament 25. Current applied to the electromagnetic coil 21 is in the range of about 0.5 to 3.5 amperes, providing a magnetic field having a strength of about 20 to 100 gauss.

Coatings comprised of any material which can be vaporized can be deposited by use of the charge neutral ion beams produced by the ion gun of this invention. Surfaces can be coated with a large variety of pure materials, including metals with high melting points.

The primary application of this ion gun is to deposit thin films comprised of materials which can be vaporized. When an inert plasma gas is used, a coating consisting only of atoms of the feed material is formed. With a chemically reactive plasma gas, a coating consisting of ions from both the plasma gas and the feed material is produced. For example, titanium may be evaporated from a crucible placed below the plasma chamber while nitrogen is provided to the receiving end of the plasma chamber, thereby forming a beam of ions of both species which produces titanium nitride when it impinges on a substrate.

Examples of most commonly used plasma gases include, but are not limited to, argon, nitrogen and oxygen. Mixtures of gases can be used for the plasma gas.

Examples of liquid and solid materials which can be evaporated and deposited onto a substrate by the apparatus of this invention include, but are not limited to, aluminum, titanium, gold, platinum, zirconium oxide, indium tin oxide, magnesium oxide and mixtures thereof.

Examples of gases which can be used in the stead of solid or liquid feedstock include, but are not limited to, hydrogen, methane, argon, chlorine, oxygen, and mixtures thereof.

Choice of feed materials for deposition will depend upon choice of material for the substrate, the choice of plasma gas feed, and desired end product.

The ion beam source of this invention was designed to produce a wide variety of coatings of various types. Coatings in a single layer, multilayered coatings, pure coatings, compound coatings and graded coatings can be produced using the apparatus of this invention.

Coatings with multiple layers can be produced by first evaporating atoms through the ion beam source with the plasma source voltage turned off, then applying a pulse to the plasma source to produce an ion beam. When the plasma is off, the deposited species will be atoms from the evaporating feed stock; when the plasma is on, the deposited species will be a mixture of atoms from the evaporating feed stock and the plasma gas. Thus alternating layers of different species will be deposited to form a multilayer coating. The mechanical or other properties of multilayer coatings can be adjusted by changing the composition and thickness of each layer.

The apparatus and methods of this invention can be used to produce compound semiconductor films. For example, silicon can be evaporated through the flow-through ion beam source using a plasma consisting of hydrogen and methane. This mixture of plasma gases would allow alpha-silicon carbides to be produced with varying compositions and hydrogen content as the ratio of the hydrogen to methane is controlled concurrently with independent control of the silicon evaporation. The band structure, and hence the electrical properties can be tailored by changing the mix during the coating operation.

Being able to control independently the flow of each of the feed components enables a wide range of materials to be deposited. Modulated electronic structures can be produced simply by changing the ratios of amounts of plasma gas feed during a coating operation using the invention of this application.

The ion beam source of this invention can be used for the production of chemically modulated nano layers. The ion beam gun can be turned on and off at selected intervals as the film grows so that a film of alternating compositions is produced. The plasma forces the production of compound formation that does not occur by chemisorption. The plasma then controls the reaction rate by controlling the arrival rate of the reactive gas relative to the condensation rate of the film. By switching a potential at the gun, the plasma can be quickly turned on and off, allowing a modulated structure to be formed. This technique allows the production of nitrides and carbides at room temperature, for example. X-ray mirrors could be produced using this method by using modulated tungsten carbide and carbon layers on a glass substrate by modulation of the tungsten evaporation from the electron beam source.

The energy of the ion beam leaving the ion beam source of this invention can be adjusted without affecting the flux of evaporated atoms entering the back of the gun. This control of ion beam energy, and the fact that all of the ions in the beam strike the substrate at the same angle, enables the production of coatings of crystalline materials having specific crystal orientations rather than randomly oriented structures. The usual orientation of a film that is cubic in nature is an orientation with the 111 plane normal to the surface of the substrate. This is because the highest packing planes are then exposed to the vapor. However, films deposited by the ion gun show orientation of the 200 perpendicular to the substrate. This then may allow a simple method to produce highly oriented or single crystal films on amorphous substrates.

Deposition onto substrate surfaces which already have an oriented crystalline structure or which have been coated with oriented crystalline materials can result in forcing of the newly deposited material into oriented crystalline structures.

Oriented diamond-like films could be deposited with the apparatus and methods of this invention. These would be of particular use for the field emitter technology employed in the flat panel display development.

These oriented crystalline films can be tailored to obtain desired combinations of properties in terms of chemical resistance, chemical diffusion and elevated temperature properties.

Because substrates can be coated with the apparatus and methods of this invention at ambient temperatures, differential thermal expansion between the films being deposited and the substrate is minimized. In addition, the intrinsic stress of the coatings is reduced. This prevents film spalling or cracking during or at the end of the coating operation. Thus, the wear resistance of coatings applied in accordance with this invention can be improved.

Substrate surfaces can be coated very rapidly using the apparatus and methods of this invention because the ion source is only used to excite the vapor, not to produce the vapor. Because the ion source of evaporated atoms and the region of the ion gun where the plasma is formed and accelerated are electrically isolated and the open structure of the grids, the ion flux produced by the gun is not controlled exclusively by space-charge physics. Space-charge limits, which are determined by the electric fields created by the grids that confine and accelerate the plasma, normally restrict the rates at which ion guns can clean surfaces or deposit thin films. Without this limitation, the ion beam source of this invention can independently control the production of ions and evaporated source material. For example, using ion-beam deposition, deposition can be carried out at about 0.2 to 0.5 Å/second. With the invention, using the experimental power levels, deposition rates of 5 Å/second were accomplished. Deposition rates of 500 Å/second are expected for a larger invention device having a sufficient power supply.

The ion source of this invention can be used to clean and/or oxidize the surface of a substrate before the same source is used to apply a coating. For cleaning prior to deposition, the ion beam source is operated using only an inert plasma feed gas.

However, if desired, in addition to sputter cleaning the substrate, the low energy ions of a chemically active gas, about 300 volts, can penetrate the surface of the substrate about 0.5–1.5 nm, thereby promoting a mechanical/chemical mix of the coating with the substrate during the coating operation.

As described here and as demonstrated by the following examples, the apparatus of this invention can be used to rapidly deposit highly adherent and smooth coatings and thin films on electrically conductive and electrically nonconductive substrates.

EXAMPLE I

This example demonstrates use of the flow-through ion beam source of this invention for cleaning a substrate before the same ion beam source is used to deposit a highly adhered coating to the substrate.

A substrate of aluminum foil was cleaned in a minimal manner by bombarding it with argon ions formed by using argon as the plasma gas for about 5 minutes. Ion current, which was determined by a small biased disk, was about 1 to 2 $mA/cm^2$. Voltage applied to the plasma chamber, which is the sum of the voltage settings of the plasma chamber power supply 7, the discharge filament power supply 24, and the power supply 22 which provides the electrical potential between the plasma chamber and the discharge filament, was 500 volts. The magnetic field was 50 gauss.

After the cleaning step, platinum in the crucible was vaporized to deposit a layer of platinum about 50 nm thick on the aluminum foil, as measured by a quartz crystal monitor.

A second aluminum substrate was coated with platinum in the same manner, except that it was cleaned for 30 minutes before starting platinum deposition.

The two resulting coated samples were examined by Auger depth profiling techniques.

Figure 2:
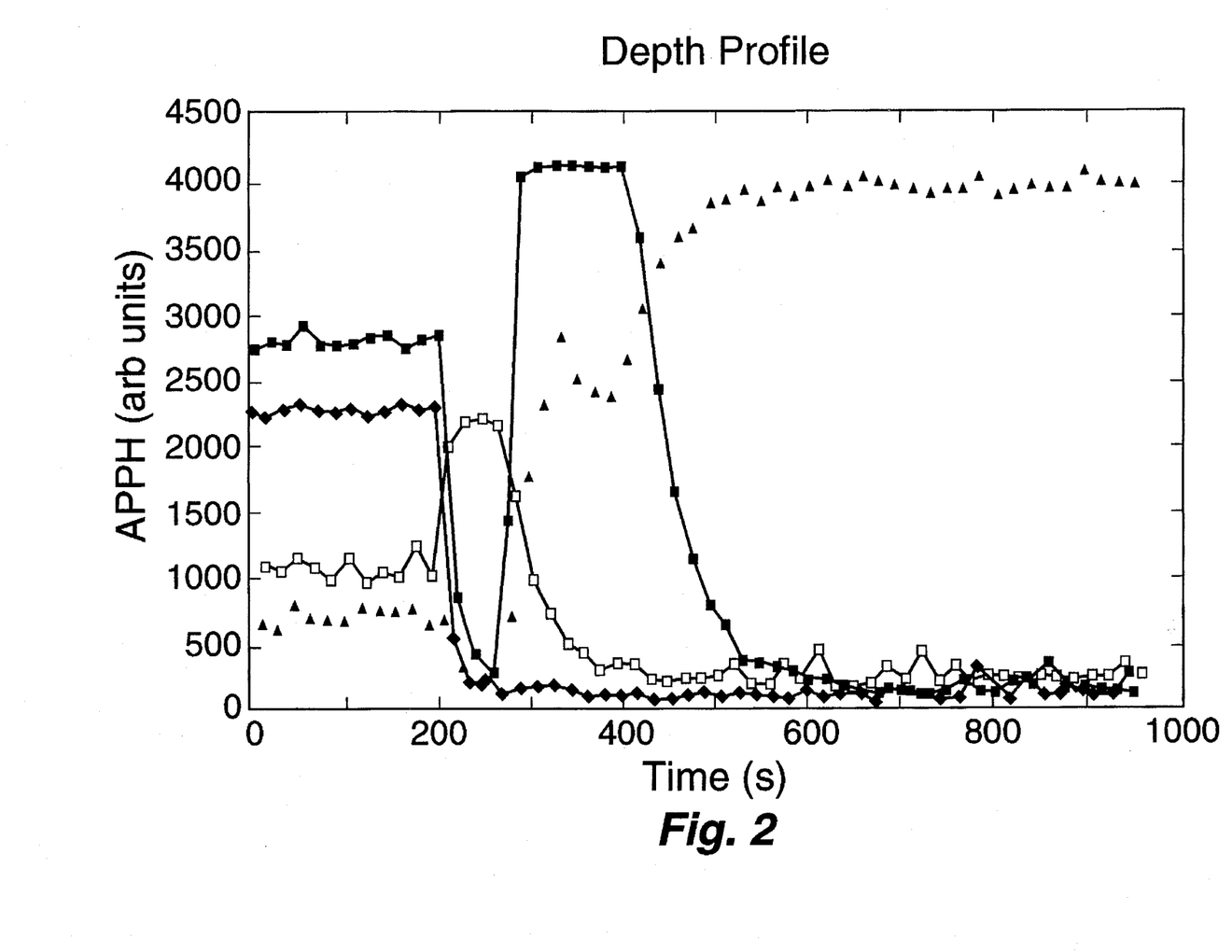
FIG. 2 is a graph of composition as a function of time in samples given a light sputter cleaning before coating, as determined by an Auger probe beam.
Figure 3:
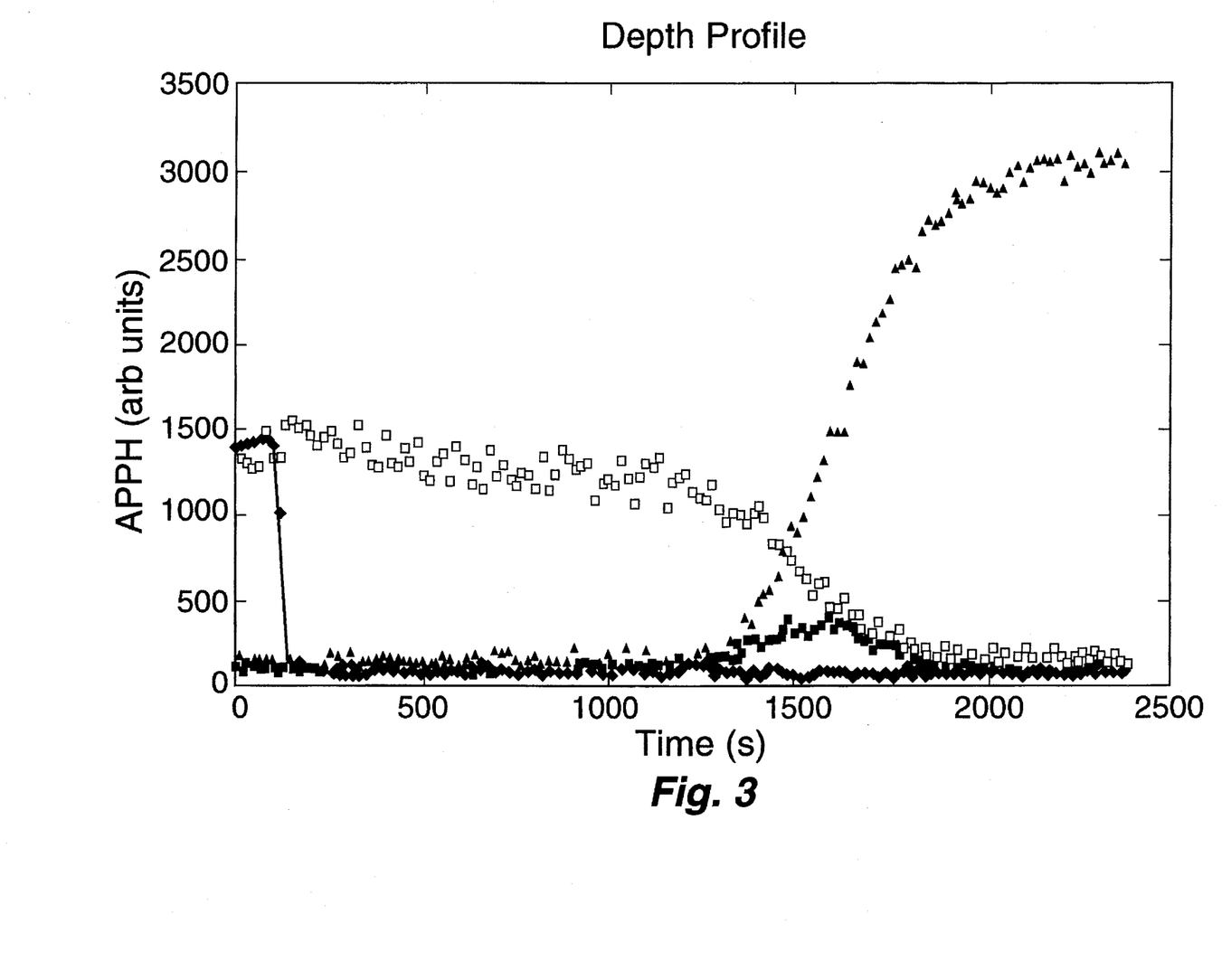
FIG. 3 is a graph of composition as a function of time in a sample given a 15-minute etch prior to coating, as determined by an Auger probe beam.

The ion sputter beam on the Auger analysis system readily removed carbon and oxygen from the outer surface of the platinum of each sample, as indicated by the Auger profile plot of composition as a function of time, shown in FIG. 2, where time is proportional to depth. When the probe beam reached the platinum/aluminum interface region, as indicated by a decreasing platinum signal and an increasing aluminum signal, the carbon signal remained low and the oxygen signal went off the scale, indicating that carbon was removed from the surface of the aluminum by the short cleaning step, but that oxygen was not removed. The profile of the sample subjected to 30 minutes of cleaning showed only a small amount of oxygen in the interface region.

Effective cleaning of a substrate surface before deposition improved film adherence.

EXAMPLE II

This example demonstrates use of the invention apparatus to deposit a thin film on the surface of pure aluminum which had micro-grooves due to machining.

A machined aluminum surface was lightly scrubbed using calcium carbonate and water. The surface was then sputter-cleaned for 15 minutes with a beam of argon ions.

A 500 nm thick gold coating was deposited on the surface of the machined aluminum substrate in the same manner as described for the platinum deposition in Example I. Argon was used as the plasma gas. Ion current was about 1 to 2 $mA/cm^2$. Voltage applied to the plasma chamber was 500 volts. The magnetic field was about 50 gauss. The current density was about 1 $mA/cm^2$ of argon gas and gold vapor.

Gold ingot was placed in the crucible as the feed material and vaporized by an electron beam gun.

Figure 4:
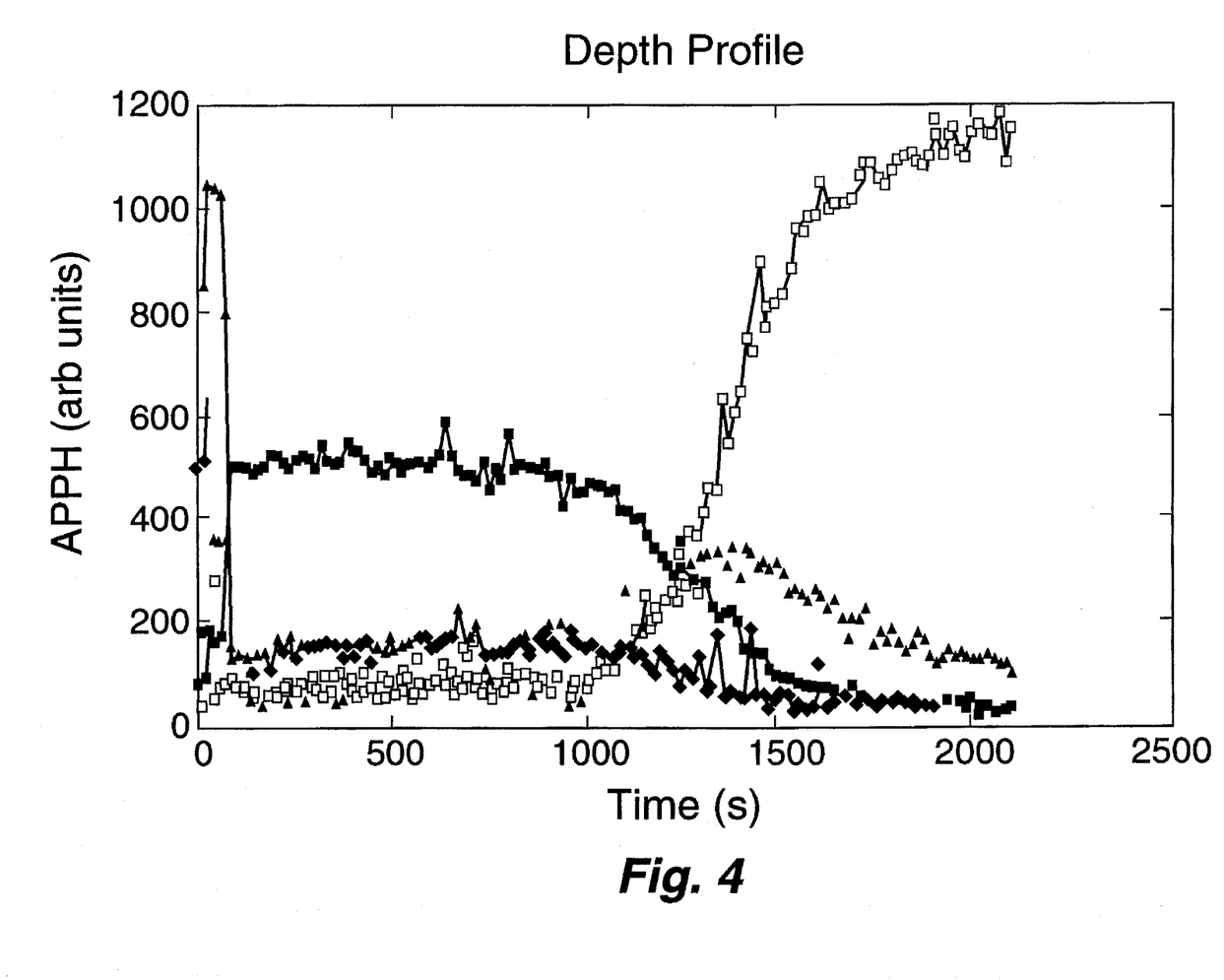
FIG. 4 is a graph of composition as a function of time of gold deposited on a machined aluminum surface in accordance with the invention.

An Auger profile plot of the samples produced in this example showed some oxygen at the gold/aluminum interface, but indicated that most of the oxygen and any oxides from machining and cleaning with the calcium carbonate was removed by the sputter cleaning step. This is shown in FIG. 4. This was a more rigorous test than that of Example I because of the microscopic grooves in the surface of the aluminum substrate as a result of the machining of the surface and since ion beam process is a line-of-sight process.

EXAMPLE III

A thin film of gold was deposited on a substrate of glass for the purpose of testing the adhesion of the thin film to the glass.

A 500 nm thick gold coating was deposited on the surface of the glass substrate in the same manner as described for the gold deposition in Example II. Argon was used as the plasma gas. Ion current was about 1 to 2 mA/cm$^2$. Voltage applied to the plasma chamber was 500 volts. The magnetic field was about 50 gauss.

Gold ingot was placed in the crucible as the feed material and vaporized by an electron beam gun.

The strength of the bond between the gold film and the glass was measured by gluing the head of a test pin to the film and applying force to the pin in a direction normal to the pin. The diameter of the test pin head was about 0.125 in. The pin separated from the substrate at a stress of about 3350 psi with a portion of the film and the substrate adhering to the pin. Thus, the glass fractured before the glue bond failed and, more importantly, before the film/substrate bond failed.

In another sample, failure occurred by glass fracture at 3200 psi. When gold is deposited on glass by prior art methods, the coating usually can be peeled from the glass by applying Scotch tape to the coating and then peeling off the tape.

EXAMPLE IV

Adhesion of a thin film of gold on aluminum was tested in the samples made in this example.

A 500 nm thick gold film was deposited on a pure aluminum substrate using the method detailed in Example II and the same equipment settings. Samples were subjected to adhesion testing as in Example III. The aluminum surface had an about 25-micron surface finish due to the machine tool.

In one sample, the glue bond between film and substrate failed at about 6000 psi. In another sample, where failure occurred at about 5000 psi, about 75% of the delaminated area was at the glue bond and 25% at the gold/aluminum interface.

INDUSTRIAL APPLICABILITY

The apparatus and process of this invention are useful for any application requiring deposition of a thin film or coating of any vaporizable material onto a conductive or non-conductive substrate. Parts used in the automotive, aerospace, and aircraft industries can be coated using the methods and apparatus of this invention. The invention methods and apparatus can be used in cleaning and coating processes in the semiconductor industry.

What is claimed is:

1. An apparatus for forming a charge neutral ion beam comprising:
   a. a means for isolating a plasma from its surrounding environment having a delivery aperture through which an ion beam passes, wherein said ion beam is formed of ions produced in said plasma;
   b. a plasma chamber having a receiving end and a discharge end, said plasma chamber being disposed within said isolating means in such manner that ions which pass out of said plasma chamber discharge end pass through said delivery aperture;
   c. a means for establishing a positive electrical potential between said plasma chamber and a reference location, whereby the magnitude of said electrical potential is effective to form a plasma;
   d. a means for providing plasma gas to said receiving end of said plasma chamber;
   e. a means for providing electrons to said receiving end of said plasma chamber;
   f. a means for providing a magnetic field within said isolating means, such that lines of force of said magnetic field are normal to an electric field formed as a result of said electrical potential applied to said plasma chamber;
   g. an accelerating grid disposed across said ion beam in a location adjacent to said plasma chamber and within said isolating means;
   h. a means for maintaining a negative electrical potential between said accelerating grid and said reference location;
   i. a means for providing electrons to said ion beam in a sufficient quantity to substantially neutralize said ion beam, wherein said electron providing means is located downstream of said accelerating grid;
   j. a retarding grid disposed adjacent to said plasma chamber receiving end;
   k. a means for maintaining said retarding grid at a positive electrical potential about equal to the value of said plasma chamber electrical potential; and
   l. a means for providing a feed material to said receiving end of said plasma chamber.

2. An apparatus as recited in claim 1 wherein said apparatus is located within a vacuum chamber.

3. An apparatus as recided in claim 1 wherein said apparatus further comprises a means for monitoring said plasma disposed within said plasma.

4. A method of forming a charge neutral ion beam comprising:
   a. establishing a positive electrical potential effective to cause formation of a plasma between a plasma chamber and a reference location;
   b. establishing a magnetic field within said plasma chamber, such that lines of force of said magnetic field are substantially normal to an electric field formed as a result of said electrical potential applied to said plasma chamber;
   c. providing electrons to a receiving end of said plasma chamber;
   d. providing a plasma gas to said plasma chamber receiving end, thereby establishing a plasma and forming an ion beam comprised of plasma ions which pass out of a discharge end of said plasma chamber;
   e. preventing ions from passing out of said receiving end of said plasma chamber by placing a retarding grid adjacent to said receiving end, where said retarding grid is maintained at a positive electrical potential about equal to the value of said plasma chamber electrical potential;
   f. accelerating ions of said ion beam by means of an accelerating grid disposed across said ion beam, where said accelerating grid is maintained at a negative electrical potential effective to accelerate ions;
   g. neutralizing said ion beam by providing electrons to said ion beam at a location downstream of said accelerating grid; and
   h. providing feed material to said plasma chamber receiving end, whereby said feed material is ionized and ions formed from said feed material become a part of said ion beam.

5. A method as recited in claim 4 wherein said ion beam is a pulsed ion beam.

6. A method as recited in claim 4 wherein number of said electrons provided to said receiving end of said plasma chamber is 300 mA.

7. A method as recited in claim 4 wherein said magnetic field is about 100 gauss.

8. A method as recited in claim 4 wherein said positive electrical potential that causes formation of said plasma is 600 volts.

* * * * *